United States Patent [19]

Fletcher et al.

[11] 4,007,434
[45] Feb. 8, 1977

[54] NOTCH FILTER

[76] Inventors: James C. Fletcher, Administrator of the National Aeronautics and Space Administration, with respect to an invention of Glenn B. Shelton, Huntsville, Ala.

[22] Filed: Apr. 14, 1976

[21] Appl. No.: 676,957

[52] U.S. Cl. .............................. 333/75; 333/70 R; 333/76; 333/82 B
[51] Int. Cl.² ..................... H03H 7/10; H03H 7/14; H03H 13/00
[58] Field of Search ............ 333/70 R, 75, 74, 76, 333/70 CR, 82 R, 82 B; 331/107 R, 101, 138, 140, 142; 330/31, 56; 328/167

[56] References Cited
UNITED STATES PATENTS 3,538,456  11/1970  Contus .......................... 333/82 B

*Primary Examiner*—Alfred E. Smith
*Assistant Examiner*—Marvin Nussbaum
*Attorney, Agent, or Firm*—L. D. Wofford, Jr.; George J. Porter; John R. Manning

[57] ABSTRACT

A notch filter for the selective attenuation of a narrow band of frequencies out of a larger band wherein a helical resonator is connected to an input circuit and an output circuit through discrete and equal capacitors, and a resistor is connected between the input and the output circuits.

5 Claims, 3 Drawing Figures

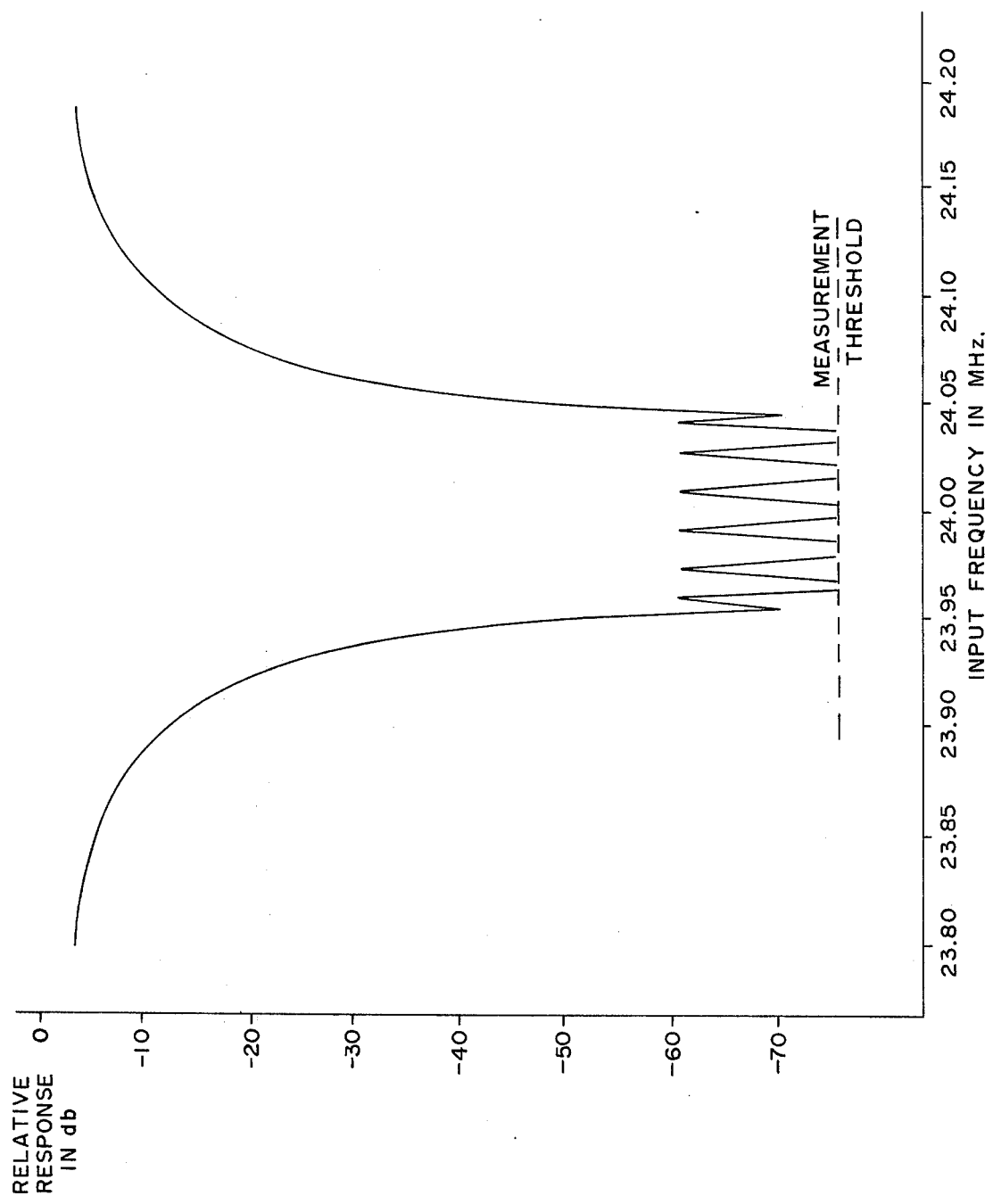

NOTCH FILTER

ORIGIN OF THE INVENTION

The invention described herein was made in the performance of work under a NASA contract and is subject to the provisions of Section 305 of the National Aeronautics and Space Act of 1958, Public Law 85–568 (72 Stat. 435; U.S.C. 2457).

BACKGROUND OF THE INVENTION

1. Field of the Invention

This invention relates to frequency or band elimination filters commonly called notch filters, and particularly to a filter of this class having improved rejection characteristics.

2. General Description of the Prior Art

The principal type of filter used as a trap or band elimination filter is a bridged-T filter consisting of two series capacitors bridged by a resistor at the top portion of the T configuration and an inductor connected between the capacitors and a common terminal. A difficulty with this filter is that for some applications the slope of the rejection characteristic on each side of the design frequency is insufficient, that is, the cutoff is not sharp enough. While improved sharpness of cutoff can be achieved utilizing crystals, the problem with the crystal filters is that spurious responses are often passed which are sufficiently close to the notch frequency to be objectionable.

Accordingly, it is an object of this invention to provide a new and improved notch filter which approximates the steepness of a crystal filter without the problem of spurious responses.

SUMMARY OF THE INVENTION

In accordance with this invention, a notch filter is constructed in the general configuration of a bridged-T filter but wherein the inductor of such a filter is replaced by a resonating circuit consisting of a coil and an enclosing container comprising a helical resonator and capacitor connecting one end of the coil to the container, the other end of the coil being directly connected to the container, and a tap point on the coil connected to the capacitors of a bridged-T configured circuit wherein the capacitors are bridged by a resistor.

BRIEF DESCRIPTION OF THE DRAWINGS

FIG. 3 is a plot of frequency response of the notch filter depicted in FIG. 2.

DETAILED DESCRIPTION OF THE DRAWINGS

Figure 1:
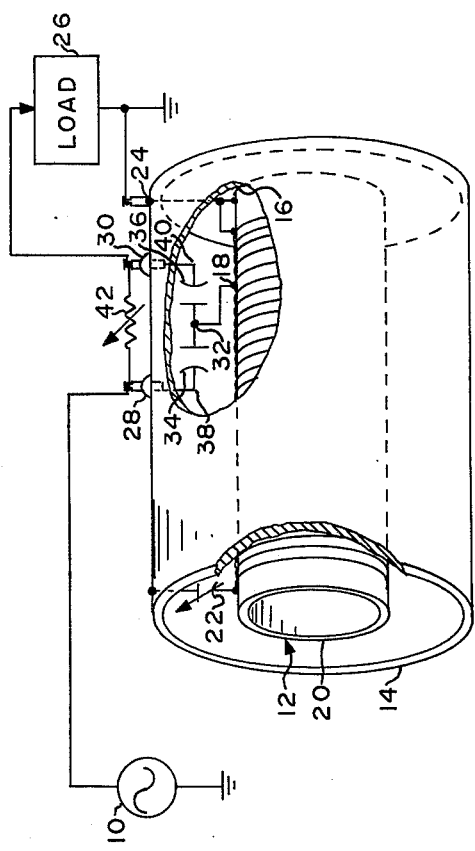
FIG. 1 is a combination pictorial-electrical schematic diagram of an embodiment of the invention.

The notch filter shown in FIG. 1 will be described as configured for the elimination of a band of frequencies centered about a frequency of $f_0$, in this case 24 MHz, and thus signal source 10 shall be assumed to contain a frequency or small band of frequencies in the vicinity of 24 MHz to be eliminated. A form of helical resonator is constructed of a coil 12 and cylinder or shell 14. Coil 12 would be held to within 0.45 and 0.6 of the diameter of cylinder 14, and in the instant case, coil 12 was constructed of a dimensionally stable paper form one inch in diameter and 1.75 inch long. A spiral groove with 18 turns per inch is cut in the form to receive AWG 22 magnet wire. The winding was started 0.5 inch from bottom end 16 and continued for 27 turns. Tap 18 is brought out four turns from bottom end 16 of coil 12. Cylinder 14 is made from 2-inch diameter copper tubing and is 2.5 inches long. Coil 12 is electrically connected at top end 20 through trimmer capacitor 22 to cylinder 14, and the opposite end of coil 12 is connected directly to terminal 24 of cylinder 14, which is a circuit ground or common point. These connections additionally function to provide physical support for coil 12. Coil tap 18 is connected at a selected impedance point spaced from end 16 of coil 12 to match the input and output impedances of source 10 and load 26 and connects through insulated feedthroughs 28 and 30 to a common terminal 32 of capacitors 34 and 36. Terminal 38 of capacitor 34 provides an input terminal between which terminal and circuit ground 24 input signals from source 10 are applied. The other terminal of capacitor 36, terminal 40, forms with circuit ground 24 and load 26 the output of the filter.

Capacitors 34 and 36 are of equal values of five picafarads, and variable resistor 42 is connected across them, between terminals 38 and 40. This resistor has a maximum value of 500 ohms, substantially less than the reactance of either of the capacitors at the center or design frequency of filter $f_0$. Coil 12, together with the distributed capacitance of coil 12 with respect to cylinder 14 and lump capacitance (0.8 to 10.0 picafarads) provided by variable capacitor 22, provides at $f_0$ a net inductance with a Q of approximately 500. The equivalent resistance of this combination at resonance, frequency $f_0$, is made equal to the equivalent resistance produced by resistor 42 and capacitors 34 and 36 by precise adjustment of the value of resistor 42.

Figure 2:
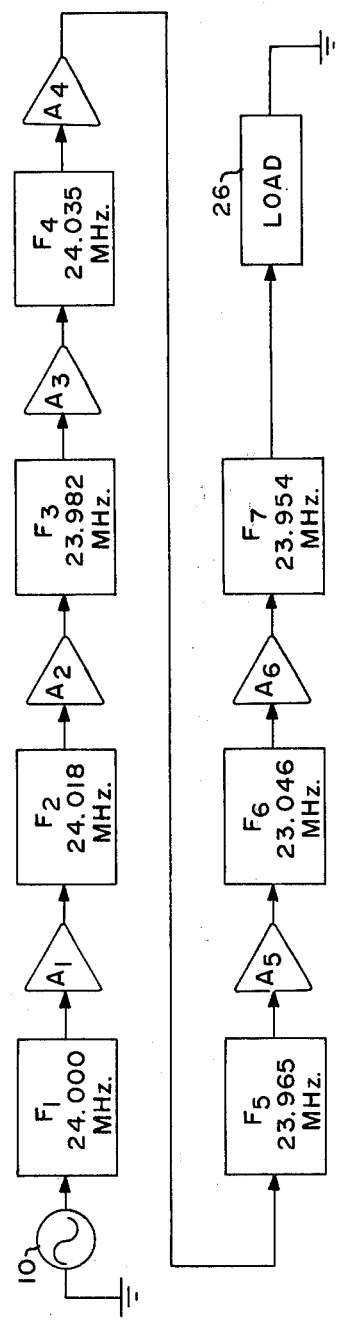
FIG. 2 is an electrical block diagram illustrative of a multi-stage notch filter circuit.

While only a single stage filter is shown, in practice it is often desirable to cascade a number of filter stages. In fact, the problem giving rise to the present invention was that of determining a notch filter having a minimum rejection of 60 db for a bandwidth of 100 KHz with 6 db reduction points having a bandwidth of less than 300 KHz. As stated above, 24 MHz was the center, or design frequency. FIG. 2 illustrates in block diagram form the filter circuit which was constructed, employing seven cascaded notch filters as illustrated in FIG. 1, each of filters $F_1$-$F_7$ being inter-stage coupled by one of amplifiers $A_1$-$A_6$. Initial alignment of the circuit is accomplished with the aid of a high frequency oscilloscope (connected to output) and sweep generator (connected to input), the function being to adjust resistor 42 of each of the cascaded filter stages. All resistors 42 are initially set to a mid-range position, and all capacitors 22 are determined from the center frequency. Then each capacitor 22 of each stage is tuned, one at a time, to 24 MHz; and its associated resistor is adjusted to provide the lowest dip on an oscilloscope display. The final alignment additionally requires a frequency counter and a spectrum analyzer connected to the output. The center of the spectrum analyzer is set at 24 MHz and set to provide a display width of 120 KHz, and attenuators of the analyzer are set so that gain is decreased by at least 60 db. The signal generator is set for 24.000 MHz; and with all of capacitors 22 detuned, generator output is adjusted to set a circuit output for a convenient reference level on the spectrum analyzer display. Capacitor 22 of filter stage $F_1$ is then adjusted for a minimum display, and resistor 42 of filter $F_1$ is readjusted for a minimum display. The display should now be more than 60 db below the reference level. Using this same technique, stage $F_2$ is aligned to 24.018 MHz, stage $F_3$ to 23.982 MHz, stage $F_4$ to 24.035 MHz, stage $F_5$ to 23.965 MHz, stage $F_6$ to 24.046 MHz, and stage $F_7$ to 23.954 MHz. As shown in FIG. 3, the 60 db bandwidth should be at essentially 100 KHz with a response ripple no higher than 60 db below the reference, and the 6 db bandwidth should be less than 300 KHz. Amplification by the inter-stage amplifiers $A_1$-$A_6$ is set to provide an overall 40 db gain with a low frequency cutoff at 2,500 Hertz and a higher frequency cutoff beyond 50 MHz.

The notch filter of this invention provides a number of advantages. An extremely high selectivity is achieved, bandwidth is controllable by cascading identical stages and stagger tuning of them, the depth of a notch is readily adjusted, excellent isolation between stages is possible, the problem of spurious responses is essentially eliminated, and component values are quite practical.

Having thus disclosed my invention, what is claimed is:

1. A filter comprising:
   a plurality of notch filters, each comprising:
   a metal cylinder including a common circuit terminal,
   a helical coil positioned within said cylinder about an axis concentric with and spaced from said cylinder, the diameter of said coil being 0.45 to 0.6 times the diameter of said cylinder, and the ratio of the length of said coil to the diameter of said coil being greater than 1,
   a first variable capacitor connecting one end of said coil to one adjacent end of said cylinder, and the opposite end of said coil being directly connected to an adjacent end of said cylinder,
   a resistor having a first terminal and a second terminal,
   a second capacitor connected between a tap point on said coil spaced from said opposite end of said coil and said first terminal,
   a third capacitor equal in value to said second capacitor being connected between said tap point and said second terminal of said resistor, each of said second and third capacitors having a reactance at a selected frequency, $f_0$, substantially greater than the resistance of said resistor, and
   the reactance of the combination of said coil and said cylinder and said first capacitor is inductive, and the equivalent resistance of said combination at frequency $f_0$ is equal to the equivalent resistance provided by the combination of said resistor and said second and third capacitors at frequency $f_0$; and
   a plurality of amplification means, each for amplifying the output of a said notch filter, a said amplification means being interconnected between the said second terminal of said resistor of one of said notch filters and a said first terminal of a following said notch filter.

2. A notch filter comprising:
   a metal cylinder;
   a helical coil positioned within said cylinder about an axis concentric with and spaced from said cylinder;
   a first variable capacitor connecting one end of said coil to an adjacent end of said cylinder, and the opposite end of said coil being connected to an adjacent end of said cylinder;
   a resistor having a first, input, terminal and a second, output, terminal;
   a second capacitor connected between a tap on said coil spaced from said opposite end of said coil and said input terminal;
   a third capacitor equal in value to said second capacitor connected between said tap and said output terminal; and
   a signal source providing signal frequencies including a frequency $f_0$ connected between said input terminal and said cylinder and an output load connected between said output terminal and said cylinder and wherein the impedance of said coil between said tap and said opposite end, the impedance of said source, and the impedance of said load are all equal at said $f_0$ frequency.

3. A notch filter as set forth in claim 2 wherein the ratio of the diameter of said coil with respect to the diameter of said cylinder is between 0.45 and 0.6, and the ratio of the length of said coil to the diameter of said coil is greater than 1.

4. A notch filter as set forth in claim 3 wherein:
   said resistor is of a value substantially less than the reactance of either of said second and third capacitors at said frequency $f_0$; and
   the reactance of the combination of said coil and said cylinder and said first capacitor is inductive and is equal to the reactance of either of said second and third capacitors at said frequency $f_0$, and the resistance of said combination at $f_0$ is equal to the resistance of said resistor.

5. A notch filter as set forth in claim 4 wherein said resistor is a variable resistor.

* * * * *